United States Patent
Heau

(10) Patent No.: US 10,344,242 B2
(45) Date of Patent: Jul. 9, 2019

(54) MECHANICAL PART COATED WITH A LAYER OF AMORPHOUS CARBON FOR SLIDING IN RELATION TO A LESS HARD COMPONENT

(71) Applicant: H.E.F., Andrezieux-Boutheon (FR)

(72) Inventor: Christophe Heau, Saint-Etienne (FR)

(73) Assignee: H.E.F., Andrieux-Boutheon (FR)

( * ) Notice: Subject to any disclaimer, the term of this patent is extended or adjusted under 35 U.S.C. 154(b) by 251 days.

(21) Appl. No.: 14/906,558

(22) PCT Filed: Jul. 7, 2014

(86) PCT No.: PCT/FR2014/051747
§ 371 (c)(1),
(2) Date: Jan. 21, 2016

(87) PCT Pub. No.: WO2015/011361
PCT Pub. Date: Jan. 29, 2015

(65) Prior Publication Data
US 2016/0152915 A1    Jun. 2, 2016

(30) Foreign Application Priority Data
Jul. 25, 2013  (FR) ...................... 13 57359

(51) Int. Cl.
| | | |
|---|---|---|
| C23C 14/06 | (2006.01) | |
| C23C 16/26 | (2006.01) | |
| C23C 28/04 | (2006.01) | |
| C10M 103/02 | (2006.01) | |
| C23C 14/02 | (2006.01) | |
| C23C 14/32 | (2006.01) | |
| C23C 16/02 | (2006.01) | |
| C10M 103/04 | (2006.01) | |
| C10M 103/06 | (2006.01) | |

(52) U.S. Cl.
CPC ........ C10M 103/02 (2013.01); C10M 103/04 (2013.01); C10M 103/06 (2013.01); C23C 14/024 (2013.01); C23C 14/0605 (2013.01); C23C 14/325 (2013.01); C23C 16/0272 (2013.01); C23C 16/26 (2013.01)

(58) Field of Classification Search
CPC ........... Y10T 428/30; Y10T 428/24355; C23C 14/0605; C23C 14/0641; C23C 16/0272; C23C 16/26; C23C 28/42; C23C 28/044; C23C 28/046; C23C 28/343; C23C 28/347; C10M 103/02; C10M 103/04; C10M 103/06
See application file for complete search history.

(56) References Cited

U.S. PATENT DOCUMENTS

2014/0178637 A1* 6/2014 Rajagopalan ......... C23C 28/044
428/141

FOREIGN PATENT DOCUMENTS

| DE | 102011076410 | 11/2012 |
|---|---|---|
| EP | 1479946 | 11/2004 |
| EP | 2647738 | 10/2013 |
| JP | 2005-003094 | 1/2005 |
| JP | 2006-283970 | 10/2006 |
| JP | 2008-019718 | 1/2008 |
| JP | 2008-164097 | 7/2008 |
| JP | 2010-126419 | 6/2010 |
| JP | 2011-052238 | 3/2011 |
| JP | 2013-091853 | 5/2013 |
| WO | 2008149707 | 12/2008 |
| WO | 2012073717 | 6/2012 |
| WO | 2015-009725 | 1/2015 |

OTHER PUBLICATIONS

International Search Report PCT/FR2014/051747 dated Aug. 25, 2014.
Japanese Office Action for Application No. 2016-528571, dated Aug. 30, 2018.
Japanese Office Action for Application No. 2016-528571, dated Feb. 26, 2018, with English translation provided.
European Office Action for Application No. 14 748 242.6, dated Jul. 5, 2018.

* cited by examiner

Primary Examiner — Joanna Pleszczynska
(74) Attorney, Agent, or Firm — Young & Thompson

(57) ABSTRACT

A mechanical part provided with an amorphous carbon coating (with at least 70 wt. % of carbon not including hydrogen) and used to cooperate slidingly with an antagonistic part having a surface hardness which is a maximum of two thirds of that of the coating. The mechanical part is such that the coating has a roughness Ra which, measured by profilometry, is equal to a maximum of 0.050 microns and, measured by atomic force microscopy, a micro-roughness which is equal to a minimum of 0.004 microns and a maximum of 0.009 microns. This minimizes the wear of the less hard antagonistic part and that of the coating.

15 Claims, 1 Drawing Sheet

Figure 1:
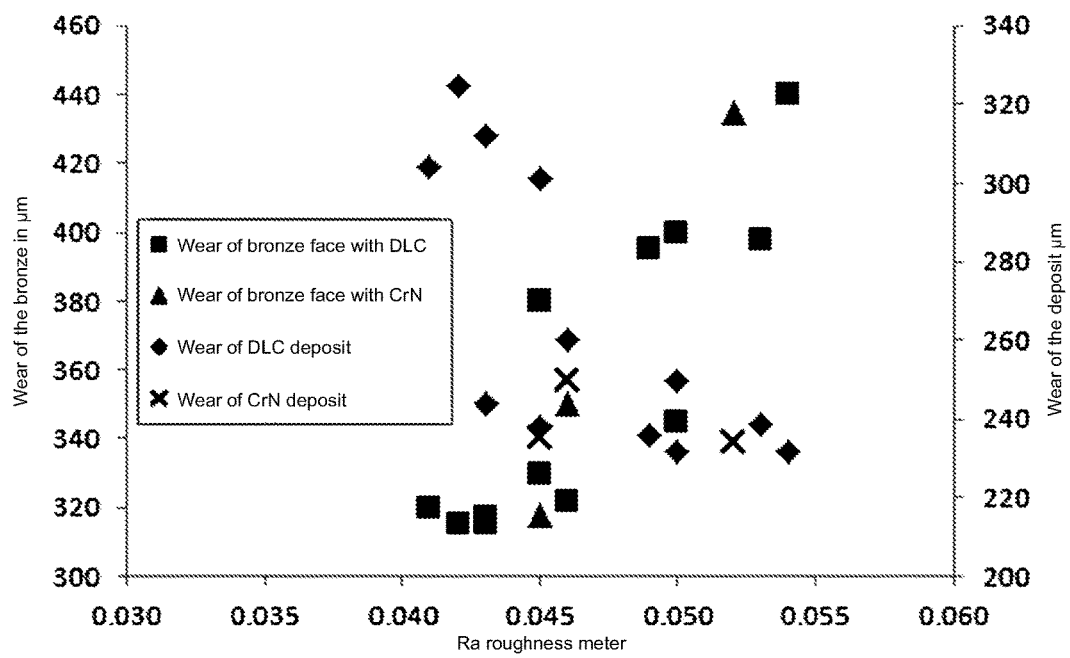

MECHANICAL PART COATED WITH A LAYER OF AMORPHOUS CARBON FOR SLIDING IN RELATION TO A LESS HARD COMPONENT

The invention concerns the treatment of mechanical parts configured to slide under high load in relation to components of softer materials. It is directed particularly, but not exclusively, to the treatment of piston pins, within combustion engines, since these components receive a hard coating of amorphous carbon (the designation "of DLC type" is sometimes encountered, DLC standing for diamond-like carbon); these concepts are detailed below) and rub against comparatively soft materials such as bronze or for instance the alloys of aluminum (either rings passed through by such a pin, or piston bodies receiving such a pin). However, the invention is more generally directed to the case of a mechanical component, most often metallic, configured to cooperate through sliding with another component of lower hardness, in a tribological application involving conditions of loads and speed known to be liable to induce notable wear.

STATE OF THE ART AND TECHNICAL PROBLEM

The treatment of piston pins, in particular by a coating of amorphous carbon, is known to the person skilled in the art. The advantage of applying this kind of coating is to forestall the dragging of the piston pin against the counterbody components often produced from bronze or aluminum.

In this connection, reference may be made to the document DE-10 2011 102 209, to the document WO-2009/144076, or for instance the document "The effect of various surface treatments on piston pin scuffing resistance" by I. Etsion, G. Halperin and E. Becher, which appeared in Wear 261 (2006) pp 785-791; this document can be found at the following address:

[http://www.technion.ac.il/~merei02/public/
2_The%20effect
%20of%20various%20surface%20treatments%20on%
20piston%20pin.pdf]

The application of such an anti-dragging coating has become necessary on account of the growing increase of the contact pressure that exists between these components. The increase in contact pressure arises from the tendency to continue to reduce the dimensions of the parts for the purpose of reducing the mass thereof and the energy lost on account of inertia.

It is generally considered by the person skilled in the art that, within a pair of components cooperating with each other by sliding/rubbing, the wear of the component having the least hardness reduces with the roughness of the surface of the component having the greatest hardness. In the case of a piston pin, it is thus usually considered that the wear of a bronze or aluminum component reduces with the roughness of a counterbody component coated with a layer of amorphous carbon; this is why, in order to limit the wear of the bronze or the aluminum, particular care is given to piston pins, via their surface state prior to deposition. Nevertheless, minimizing the roughness prior to deposition is not sufficient and must often be complemented by a final treatment operation directed to reducing the roughness of the coated part; such a final operation may consist of brushing (according to the procedures known to the person skilled in the art).

However, it has been found that, in certain conditions, neither the bronze, nor the aluminum wear, whereas the wear of the coating of amorphous carbon becomes abnormally great, despite the high hardness of such a coating of amorphous carbon. Thus two coatings having identical mechanical characteristics and characteristics of roughness (in the macroscopic sense of the term, see below) may behave totally differently. In one case, high wear may be noted of the counterbody part (of lower hardness, or "soft" material), and extremely low wear of the coating, whereas in another case, the soft material is characterized by minimal wear in combination with high wear of the coating, without the reason for this being known.

It can easily be understood that, for proper operation of the system, each of the two counterbody parts must have minimum wear in order to ensure long life for the components.

There is therefore a need to be able to manufacture and characterize a part provided with an amorphous carbon coating (with at least 70% at. carbon, or even at least 90% at., excluding hydrogen) so as to ensure that, in combination with a counterbody part of substantially lower hardness (for example less than ⅔ of the hardness of the coating), neither of the two parts has high wear in use.

Solution to the Technical Problem

To make it possible to control the wear of a part coated with a hard thin layer of amorphous carbon, composed essentially of carbon (at more than 70% atomic, excluding the amount of hydrogen), which is configured to rub against a softer material, that is to say of which the hardness is more than 1.5 times smaller than that of the coating, the invention teaches conditions for the roughnesses at macroscopic scale (conventional measurement) and at microscopic scale (by atomic-force microscopy, in practice over an area less than 100 µm$^2$).

More specifically, the invention furnishes a part provided with a coating of amorphous carbon (at least 70% at. carbon) and configured to slidingly cooperate with a counterbody part of which the surface hardness is at most two thirds of that of the coating, that coating having a roughness Ra which, measured by profilometry, is at most equal to 0.050 microns and, measured with atomic-force microscopy, a micro-roughness which is at least equal to 0.004 microns and at most equal to 0.009 microns.

It should be understood here that the roughness Ra is the roughness of the part bearing this coating.

As a matter of fact it has become apparent that compliance with these ranges of roughness, measured using two different techniques, led to a moderate wear of such a coated part, without leading to high wear of the counterbody part which is much less hard, independently of the particular characteristics of any lubricant interposed between the rubbing surfaces.

To differentiate these two concepts of roughness (in terms of arithmetic average), the word "roughness" is reserved below for what is measured by a conventional means) and the expression "micro-roughness" is used for roughness measured using atomic-force microscopy.

The means for measuring conventional roughness, is limited in resolution, by the size of the point (it typically has a local radius of 2 microns); the point employed in atomic-force microscopy is of several orders of magnitude smaller (it typically has a local radius of 0.01 microns or possibly less); the AFM point thus makes it possible to see smaller details than those which a conventional means can detect.

The principle of setting maximum and minimum values of the roughness of a part coated with a film of DLC (diamond-like carbon) has already been proposed, in the document WO-2012/073717; a coating of DLC is recommended therein containing from 4.5% at. to 30% at. of hydrogen, and a root mean square roughness comprised between 5 nm and 25 nm (i.e. 0.005 and 0.025 microns); however, the existence of a minimum threshold is in no way associated with an intent to minimize the wear of the DLC layer and of a counterbody part, but it proposed to ensure a sufficient level of rubbing to generate the energy necessary for the reactions enabling the action of the additives provided in the particular lubricant used (the lubricant contains a molybdenum-based compound and additions of zinc and sulfur, and the description made in the documents seeks to ensure the formation of $MoS_2$); in fact, this document recommends that both parts be of comparable materials, thus between which there is no great difference in hardness and between which the technical problem at the base of the present invention cannot arise. Whatever the case, the document does not disclose the advantage of measuring the roughness by the technique of atomic-force microscopy, nor a fortiori the advantage of setting thresholds for the roughness measured conventionally (by profilometry) and by that very particular technique. If consideration is limited solely to roughness by conventional measurement (in terms of root mean square roughness, and not RA, in terms of arithmetic average), it is to be noted that this document teaches a maximum value considerably less than the maximum value of the present invention (in terms of arithmetic average Ra), which would very likely be incompatible with the AFM micro-roughness range of the invention. In other words, the invention implicitly teaches a range of roughness, in terms of conventional measurement, which is greater than that of this document.

Preferably (but not necessarily), this value of roughness Ra measured by profilometry is greater than a threshold of 0.020 microns, or even 0.025 microns. It should be noted here that this is the roughness of the coating, which may be different from that of the surface prior to coating.

Preferably, the roughness measured by profilometry is at most equal to 0.046 microns and the micro-roughness in terms of atomic-force microscopy is comprised between 0.004 and 0.0075 microns; such restricted ranges would seem to be still better able to ensure a low level for the wear of the two counterbody parts; it is however to be noted that the invention is not is directed to identifying a necessary and sufficient condition in order for the wear of the two parts to be moderate; it is simply directed to providing a sufficient condition to obtain such a result.

According to preferred features of the invention, which may be combined:

The coating contains hydrogen in an amount of 20+/−5% at., measured according to the ERDA technique, The part comprises under the coating of amorphous carbon, which is hydrogenated, a layer of at most one micron of CrN, The coating comprises tungsten doping over at most one micron from the surface of the part, for a film of at least two microns.

The invention furthermore provides a pair of slidingly cooperating parts, comprising one part of the aforementioned type and a counterbody part of which the surface hardness is at moist two thirds that of the coating.

By way of example, this counterbody part may be produced from a copper-containing alloy, such as bronze; as a variant, it may be produced from an aluminum alloy, for example from AlSn. It may also be said that it is tin alloys. Such a counterbody part may be formed from such a material only on the surface.

Figure 2:
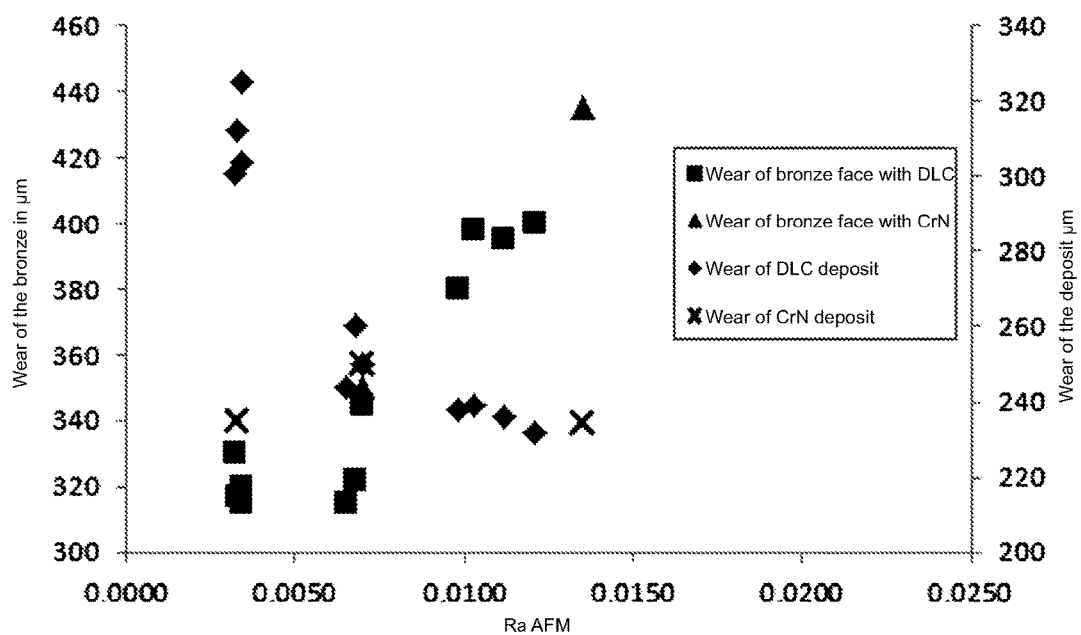

Objects, features and advantages of the invention will appear from the following description, given by way of illustrative non-limiting example with reference to the accompanying drawing in which:

FIG. 1 is a diagram correlating the roughness of various examples of coated parts with the wear of that part and of that of a bronze counterbody part; and FIG. 2 is a diagram correlating the micro-roughness of various examples of coated parts with the wear of that part and of that of a bronze counterbody part

DETAILED DESCRIPTION OF AT LEAST ONE EMBODIMENT

Consideration is given below of metal parts, in practice of steel, coated with a film of amorphous carbon, adapted to cooperate with a counterbody part of bronze (or even of aluminum), in conditions simulating the operating conditions of a piston spindle (or pin) within an engine; it may be the articulation of the spindle to the crankshaft or the articulation of the spindle to the piston itself.

Examples with a CrN coating serve as items for comparison.

The conventional measurement of roughness Ra makes it possible to define the necessary level required, based on the usual approach, in order to limit the wear of the counterbody part (bronze or aluminum, in particular) of the pin coated with the hard layer. Nevertheless, for a given coating, the conventional characterizations of the coated part do not enable it to be determined whether the coating will or will not undergo wear. For the same values of roughness Ra (measured in conventional manner) and hardness, it is possible for one of two apparently similar coatings to suffer no wear and for the other, on the contrary; to undergone excessive wear, without the reason having yet been understood (it cannot simply be the abrasion on account of the high level of the ratio between the hardnesses of the counterbody part parts). According to one aspect of the invention, the surface examination of parts by atomic force microscopy (or AFM) technology contributes to enabling determination of the ideal topography which the coated part must have to minimize the wear of two counterbody parts.

In the following examples, piston pins, initially identical (the only difference being within manufacturing tolerances) were respectively coated with deposits of chromium nitride CrN and various types of amorphous carbon-based materials; currently the abbreviation DLC is quite often used as a synonym for all forms of amorphous carbon; in fact, the abbreviation DLC ("Diamond Like Carbon") designates the carbon that has carbon atoms presenting hybridization as in diamond and should be reserved for this form of amorphous carbon. Below, the abbreviated names will take the abbreviation DLC for the various forms of amorphous carbon, for reasons of simplicity, whether it be hydrogenated amorphous carbon, non-hydrogenated amorphous carbon (for which the abbreviation DLC would appear completely right), or tungsten-doped amorphous carbon.

The piston pins were characterized, prior to coating, by a roughness measurement Ra of 0.025 µm and a roughness measurement Rpk of 0.040 µm. Roughness measurements Rpk are given here in complement of the roughness measurements, to complete the characterization of the examples. As indicated above, the coatings which will be deposited may have very different roughnesses, in particular according to the modalities for forming these coatings.

Below, the hardness measurements Hv corresponding to a load of 10 to 30 mN, adapted to the thickness of the coating and to its hardness, such that the depth of indentation is of the order of one tenth of the thickness of the deposit; thus the measurement of hardness does not integrate the hardness of the substrate in significant manner.

The layers of CrN were produced by magnetron sputtering, for which it is to be noted that this type of deposit usually gives rise to sub-stoichiometric layers. The nitrogen content is situated at 40+/−5% atomic. These CrN deposits are characterized in practice by a Vickers hardness of 1800+/−200 Hv. Two thicknesses of deposit have been envisioned, 1 μm and 2 μm, hence the designations CrN1 and CrN2, respectively.

The deposits of hydrogenated amorphous carbon are conventionally produced by chemical vapor deposition (CVD) in argon; preferably, the deposition technique is a particular form of CVD, i.e. Plasma assisted CVD (PACVD) or Plasma Enhanced CVD (PECVD). These layers are characterized by a hardness of 3000+/−400K which corresponds to a hydrogen content measured with ERDA of 20+/−5 at. %. These layers were deposited at a thickness of 2 microns over a sub-layer of CrN having two possible thicknesses:

a double deposit of 0.8 μm CrN then 2.0 μm of hydrogenated amorphous carbon is here called DLC1,
a double deposit of 1.5 μm CrN then 2.0 μm of hydrogenated amorphous carbon is here called DLC2, By way of variant of the reference DLC1, another deposit of hydrogenated amorphous carbon was formed by varying the conditions of deposition of CrN, in particular by increasing the total pressure of argon; this deposit is designated DLC3 below.

The coating of non-hydrogenated amorphous carbon is produced by cathodic arc deposition technology. Its hardness was measured at 4500 Hv. It was considered at a single thickness, i.e. a thickness of one micron; the coating so obtained is designated DLC4 below. The deposit of non-hydrogenated amorphous carbon, DLC (or taC) is formed by a PVD technique (cathodic arc deposition of graphite).

Lastly, the deposit of tungsten-doped hydrogenated amorphous carbon was produced by magnetron cathodic sputtering using a tungsten carbide target, in an atmosphere containing a hydrocarbon partial pressure. This deposit is characterized by a hardness of 1400 Hv and a W content of 10% atomic (excluding hydrogen). It may be analyzed as being formed from a sub-layer of WC covered with carbon (with a progressive rise in the carbon content until it reaches 90%; the coating considered here comprised a layer of WC of 0.6 μm thickness (which progressively enriches in carbon) for a total thickness of 2.5 μm; this coating is called DLC5 below.

It should be recalled (see above) that the hardnesses mentioned above are in fact hardnesses of the coatings, despite their small thicknesses, and not hardnesses of the underlying materials.

The coatings of amorphous carbon are notably harder than those of CrN, especially when they are not hydrogenated (generally formed from 100% carbon—DLC case), with the exception of the coating of tungsten-doped hydrogenated amorphous carbon; therefore, the coatings of amorphous carbon (hydrogenated or non-hydrogenated, non-tungsten-doped) usually have a resistance to wear, in particular by abrasion, higher than the coatings of CrN.

Lastly, these coating have undergone or not undergone a final step of brushing of greater or lesser intensity according to procedures that are known per se.

The brushing was characterized by two main quantities, the bearing pressure of the brush and the number of passages of the brush, as is shown by the following table.

| Type of brushing | Pressure | Number of passages |
|---|---|---|
| + | 0.4 bars | 1 |
| ++ | 1.5 bars | 1 |
| ++++ | 1.5 bars | 4 |

Such brushing makes it possible to eliminate excrescences which could be formed in the operation of deposition of the layers and which constitute peaks liable to aggravate the wear of the counterbody part, in the manner of a rasp. These excrescences have very low mechanical strength, which means that they are eliminated after the slightest brushing. The result of more intense brushing is to polish the surface of the deposit.

All these parts underwent roughness characterizations not only by profilometry, but also micro-roughness measurements using the technique of atomic force microscopy "AFM" producing images of 5×5 μm. In other words, the various parts were the subject of a (conventional) macroscopic measurement of roughness using a roughness meter (at the scale of the tenth of a micron) and a nanometric measurement by AFM (at the ten nanometer scale); as indicated above, this roughness is called "micro-roughness" to identify it relative to macroscopic roughness.

All these parts were lastly characterized in tribological terms, directed to quantifying not only the wear of the coated part, but also the wear of the counterbody part produced in a metal qualified here as soft (that is to say of which the hardness is at most two thirds of that of the coating considered).

In the following examples, the soft metal is a bronze cylinder of 10 mm diameter of which the Ra of 0.3 μm is representative of an actual part. Friction tests were carried out in a configuration of cross axis type: the relative movement was produced in the direction parallel to the striations on the piston pin and the contact point was moved over a generatrix of the bronze pin over a travel of 10 mm. The applied load was 11.6 N. The average speed of sliding was 100 mm/s in an alternating movement given by an eccentric system. Prior to testing, the contact was moistened with a drop of SAE5W30 oil. The system was heated out 110° C.

After 9000 test cycles, the wear was characterized by the measurement of the dimensions of the sliding zone. For the bronze pin, the measurement was made along the width of the rubbing track. For the coated part, the wear measurement was made in the direction of rubbing. It has been noted that the initial width of contact on the bronze was 320 μm; therefore, dimensions of rubbing tracks, on the bronze, of the order of 320 μm to 340 μm, denote low or inexistent wear of the bronze. Similarly, the dimension of the initial surface area on the coated pin in the direction of rubbing, was 240 μm; dimensions up to 260 μm thus indicate low wear of the coating. It should be noted that, since the coatings are substantially harder than the counterbody parts, their wear cannot correspond to abrasion.

The following table correlates various characteristics of the coatings. Wear measurements may correspond to values lower than the initial measurements mentioned below, in particular on account of measurement uncertainties (in fact, the test samples are cylinders of which the roughness and geometry are not as ideal as the characteristics used for the calculation of the dimensions of the contact; the effect of the real geometry and the real topography may be that the initial area, which theoretically corresponds to an ellipse, may be slightly less than 240 μm.

| Test | deposit | finish | Roughness meter Ra (conv) | Roughness meter RPk | AFM μRa | Deposit wear | Bronze wear | conformity |
|---|---|---|---|---|---|---|---|---|
| 1 | DLC 2 | no | 0.053 | 0.080 | 0.0103 | 239 | 398 | no |
| 2 | DLC 2 | ++++ | 0.045 | 0.066 | 0.0098 | 238 | 380 | no |
| 3 | DLC1 | no | 0.046 | 0.045 | 0.0068 | 260 | 322 | yes |
| 4 | DLC1 | + | 0.043 | 0.040 | 0.0065 | 244 | 315 | yes |
| 5 | DLC1 | ++ | 0.041 | 0.037 | 0.0034 | 304 | 320 | no |
| 6 | DLC1 | ++++ | 0.045 | 0.042 | 0.0032 | 301 | 330 | no |
| 7 | DLC3 | no | 0.050 | 0.070 | 0.0121 | 232 | 400 | no |
| 8 | DLC3 | ++++ | 0.049 | 0.064 | 0.0112 | 236 | 395 | no |
| 9 | DLC4 | no | 0.054 | 0.095 | 0.0980 | 232 | 440 | no |
| 10 | DLC4 | ++++ | 0.043 | 0.046 | 0.0033 | 312 | 317 | no |
| 11 | DLC5 | no | 0.050 | 0.075 | 0.0070 | 250 | 345 | borderline |
| 12 | DLC5 | ++ | 0.042 | 0.040 | 0.0034 | 325 | 315 | no |
| 13 | CrN 1 | + | 0.046 | 0.042 | 0.0070 | 250 | 350 | no |
| 14 | CrN 2 | + | 0.052 | 0.079 | 0.0135 | 234 | 435 | no |
| 15 | CrN 1 | ++++ | 0.045 | 0.038 | 0.0033 | 235 | 318 | no |

These results are furthermore shown on the graph of FIG. 1 (roughness measurement Ra by means of a roughness meter having a probe of 2 μm radius) and on the graph of FIG. 2 (AFM micro-roughness, denoted μRa for short):

The squares represent the instances of wear in microns of a bronze part facing a DLC coating (scale on the left), The diamonds represent the instances of wear of the DLC coatings (scale on the right), The triangles represent the instances of wear of a bronze part facing a CrN coating (scale on the left), and The crosses represent the instances of wear of the CrN coatings (scale on the right).

It can be assumed that the two scales of roughness measurement do not give exactly the same information: most of the macroscopic roughness arises from the machining of the part prior to depositing the coating whereas the micro-roughness mainly characterizes the growth of the coating, with a lower incidence of the aforementioned machining.

In the diagram of FIG. 1, a result known from the prior art can be found, i.e. that the wear of the bronze is in relation to the roughness of the counterbody part, when it is measured conventionally. The reduction in roughness of the coated part naturally induces the reduction in the wear of the counterbody, which is softer.

This diagram of FIG. 1 however shows, contrary to what could be assumed, that the DLC coatings may undergo high wear, even though their nature does not predispose them to wear (they are harder than the bronze parts). Furthermore, the wear of the coatings is not in relation with their roughness. In fact, as regards the coatings of CrN, wear is observed which appears not to depend on the roughness of the coating, whereas, as regards the DLC coatings, it is believed that it even possible to read a negative correlation, that is to say that the wear is all the greater when the roughness is low.

Similar comments may be made with regard to the diagram of FIG. 2, it being noted that the wear of the bronze parts is almost proportional to the AFM roughness (the average intercepts the abscissa line for a very low value of AFM roughness). As regards the wear of the parts coated in amorphous carbon, this seems to remain reasonable so long as this AFM roughness exceeds the order of 0.0050 microns (concerning the coatings of CrN, the wear remains low in all cases).

In other words, these measurements of roughness and micro-roughness show that there is an inversely proportional relationship between the roughness and the micro-roughness of the coated part and its wear facing a counterbody part could easily be less hard (or softer), since it is apparent that it is the smoothest layers of amorphous carbon which have the greatest wear.

More particularly, among the layers of hydrogenated amorphous carbon (DLC1 to DLC3):

The instances of wear of the bronze counterbody parts hardly drops when the coatings are brushed (it can even be noted that, allowing for the measurement uncertainties, there is no appreciable difference between examples 3 and 6), The wear of the bronze counterbody parts does not reduce (or even increases) progressively with improvement of the brushing (see the DLC1s), The Ra roughness of the coating drops when brushing is carried out, but prolonging the brushing does not necessarily have a favorable effect on that reduction, However, the AFM micro-roughness of the coating drops when brushing is carried out and reduces further progressively with continuation of the brushing, the minimum micro-roughness being observed with the DLC1s (with the thinnest sub-layer of CrN), Brushing does not lead to a reduction in the wear of the coating (DLC2, DLC3); if a small reduction is noted in relation to DLC1, prolonging the brushing even results in promoting the wear.

Except as regards these DLC1s that have undergone prolonged brushing, the wear of the coating remains moderate (below 260 microns)

The increase in the underlying CrN layer does not have a favorable effect on the wear of the bronze parts; on the contrary, only the DLC1 coatings, with an underlying layer scarcely 0.8 microns thick, have moderate wear, in the unbrushed or little brushed state, The increase in the argon pressure during the deposit of the coating does not have a visible positive effect (compare the DLC2s and the DLC3s).

As regards the non-hydrogenated DLCs (DLC4):

Brushing of the coating appears to be necessary to maintain a reasonable level of wear of the bronze counterbody part, but to the detriment of the wear of the coating, It can be considered that moderate brushing is capable of leading to an acceptable compromise.

Lastly as regards the DLCs with tungsten (DLC5):
  Brushing appears to have a positive effect on the wear of the bronze counterbody part, but that wear remains moderate even in the absence of such brushing,
  However the positive effect of the brushing for the counterbody part appears to be to the detriment of the coating wear.

It may be noted that the fact of performing brushing is an operation provided by the specifications of the manufacturers of piston pins for the purpose of eliminating growth defects of the coating; however, given their very low density (except for the non-hydrogenated amorphous carbon deposits, which according to the specificities of the production technique, may have very large quantities of growth defects), it appears doubtful that these defects can have a significant influence on the wear phenomena indicated above.

It may be noted that examples 1 and 7 to 9 are cases that conform to a situation known to the person skilled in the art, that is to say that a high wear of the bronze counterbody parts is found with the roughest coated test samples (more than 0.050+/−0.001 microns of Ra roughness), even if there is no true proportionality between the roughnesses and the wear (example 1 is rougher than example 7 while leading to less wear; the roughness is not indeed the only parameter involved). It is to be noted that the AFM micro-roughnesses found on these examples are among the highest values noted (greater than 0.0090).

As regards examples 5, 6, 10 and 12, it may be noted that they corresponds to high values of wear of the coatings. This result appears surprising for the person skilled in the art since the coatings on these parts are not distinguished in terms of mechanical or chemical characteristics of their roughest corresponding layers. Although the coating are much harder than the bronze counterbody (substantially softer), a high wear is apparent. The examination of the roughness by AFM technique reveals that at the scale of a few μm², these layers are distinguished from the other layers by a particularly low Ra (less than 0.004 μm).

It may be noted that example 11 corresponds to wear of the bronze part that is scarcely greater than the threshold indicated and may be considered as borderline.

This leads to it being considered that, when a coating of amorphous carbon (at least 70% at. of carbon) has an Ra roughness at most equal to 0.050 microns, in combination with an Ra AFM micro-roughness greater than 0.004 microns but less than 0.009 microns, there is a combination of low wear of the coating and of the bronze counterbody part (although it is substantially less hard than the coating).

Indeed, only the examples meet the aforementioned dual condition leading to low wear of both mutually rubbing parts.

It would appear that the instances of wear are all the lower when the roughness of the coating:
  Is at most equal to 0.046 microns by conventional measurement
  And is comprised between 0.004 and 0.0075 microns by AFM.

It should be stressed that the good examples thus identified correspond to coatings that are not brushed or scarcely brushed, with hydrogenated amorphous carbon (preferably with a hydrogen content having a thin underlying layer of CrN (apparently not more than one micron) or tungsten-doped hydrogenated amorphous carbon (apparently not more than one micron either). As regards non hydrogenated amorphous carbons, it appears that moderate brushing can lead to meeting the aforesaid conditions and thus to moderate mutual wear.

Moreover, it follows from the above that the nature of the coating is decisive since examples 1 to 12, comprising an amorphous carbon-based hard layer (more than 70% atomic excluding hydrogen), lead to different conclusions from examples 13 to 15, obtained with a CrN coating. In particular, as for the layers of amorphous carbon, the CrN deposits lead to increased wear of the bronze when the roughness of the coated part increases, whereas at low or very low roughness the layers of CrN do not wear and do not wear the bronze counterbody. These results show that the phenomenon of wear of the amorphous carbon coatings is neither mechanical nor abrasive, since these layers are harder than the CrN or appreciably more than 1.5 times harder than the counterbody. Thus, the high wear of the amorphous carbon layers at very low roughnesses is not a phenomenon that is common and known to the person skilled in the art. As the coating in question are mainly composed of carbon, it is possible to imagine, without wishing to be bound button such an interpretation, that a mechanism is involved which may be of tribo-oxidation type, and thus unaffected by the hardness of the carbon layers.

Solely from a point of view of resistance to wear, a very smooth layer of CrN meets the expected function. However, with the continuing aim of reducing friction, the coating of amorphous carbon are preferred to CrN because they enable lower coefficients of friction. The roughness ranges identified above make it possible to ensure reasonable levels of wear.

It may be noted that, in the above table, a column is situated between the columns Ra and μRa (AFM), of which the title is RPk; this column contains the roughness obtained according to a roughness measurement variant. It may be noted that this other way of characterizing the roughness enables similar conclusions to be reached.

The above conclusions generalize to other pairs of materials; thus, more generally, the counterbody part (having the low hardness defined above) may be of some or other copper alloy, or of some or other aluminum alloy; this may in particular be the case for piston pins. It may be a tin alloy such as AlSn (in particular used on certain crankshaft bearings or on a connecting rod head. It may be understood that this counterbody part may be of a soft material just at the surface (and comprise a core of another material).

It is worth stressing that it is within the capability of the person skilled in the art, knowing the roughness and the micro-roughness to obtain, to adjust the conditions of deposition. Indeed, a set of operational parameters are available to the person skilled in the art to vary the morphology of the deposits and even the PVD sub-layers, the PVD layers generally grow with a structure of columns of which the size increases with the thickness, which affects the roughness.

The invention claimed is:

1. A mechanical part provided with a coating of amorphous carbon, with at least 70% at. carbon excluding hydrogen,
  wherein the mechanical part is configured to slidingly cooperate with a counterbody part whose surface hardness is at most two thirds of the surface hardness of the coating, the coating having a roughness Ra which, measured by profilometry, is greater than 0.025 microns and at most equal to 0.050 microns and, measured with atomic-force microscopy, a micro-roughness which is at least equal to 0.004 microns and at most 0.009 microns.

2. The part according to claim 1, wherein the roughness Ra, measured by profilometry, is at most equal to 0.046 microns and the micro-roughness by atomic force microscopy is comprised between 0.004 and 0.0075 microns.

3. The part according to claim 1, wherein the coating contains hydrogen in an amount of from 15% at. to 25% at., measured according to the ERDA technique.

4. The part according to claim 1, further comprising:
under the coating of amorphous carbon, which is hydrogenated, a layer of CrN having a thickness of at most one micron.

5. The part according to claim 1, wherein the coating of amorphous carbon has a thickness of at least two microns, the coating being doped with at most one micron of tungsten from a surface of the part.

6. The part according to claim 2, wherein the coating contains hydrogen in an amount of from 15% at. to 25% at., measured according to the ERDA technique.

7. The part according to claim 2, further comprising:
under the coating of amorphous carbon, which is hydrogenated, a layer of CrN having a thickness of at most one micron.

8. The part according to claim 3, further comprising:
under the coating of amorphous carbon, which is hydrogenated, a layer of CrN having a thickness of at most one micron.

9. The part according to claim 2, wherein the coating of amorphous carbon has a thickness of at least two microns, the coating being doped with at most one micron of tungsten from a surface of the part.

10. The part according to claim 3, wherein the coating of amorphous carbon has a thickness of at least two microns, the coating being doped with at most one micron of tungsten from a surface of the part.

11. The part according to claim 4, wherein the coating of amorphous carbon has a thickness of at least two microns, the coating being doped with at most one micron of tungsten from a surface of the part.

12. A pair of slidingly cooperating parts comprising:
the part according to claim 1; and
the counterbody part whose surface hardness is at most two thirds of the surface hardness of the coating.

13. The pair of parts according to claim 12, wherein the counterbody part is of a copper alloy.

14. The pair of parts according to claim 12, wherein the counterbody part is an aluminum alloy.

15. The pair of parts according to claim 12, wherein the counterbody part is a tin alloy.

* * * * *